United States Patent
Ayyapureddi et al.

(10) Patent No.: US 7,573,288 B2
(45) Date of Patent: Aug. 11, 2009

(54) DYNAMICALLY ADJUSTING OPERATION OF A CIRCUIT WITHIN A SEMICONDUCTOR DEVICE

(75) Inventors: Sujeet Ayyapureddi, Boise, ID (US); Raghukiran Sreeramaneni, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/856,352

(22) Filed: Sep. 17, 2007

(65) Prior Publication Data
US 2009/0072855 A1    Mar. 19, 2009

(51) Int. Cl.
*H03K 17/16* (2006.01)
(52) U.S. Cl. .......................................... 326/30; 326/87
(58) Field of Classification Search ................. 326/26, 326/27, 30, 82–87
See application file for complete search history.

(56) References Cited

U.S. PATENT DOCUMENTS 6,031,385 A * 2/2000 Ilkbahar ..................... 324/763

OTHER PUBLICATIONS

Farrell, T., "Core architecture doubles mem date rate"; EE Times Asia; Dec. 16, 2005; EE Times Asia; eMedia Asia Ltd.; New York, NY; http://www.eetasia.com/MUL_technical-articles_32_TA.HTM.

Allan, G., "start: The outlook for DRAMs in consumer electronics"; EDA Tech Forum; Jan. 12, 2007; CMP Media LLP; Manhasset, NY; http://edadesignline.com/196900432;jsessionid=IP1AF51SS4QEEQSNDLPCKHSCJUNN2JVN?printableArticle=true.

* cited by examiner

*Primary Examiner*—Don P Le
(74) *Attorney, Agent, or Firm*—Leffert Jay & Polglaze, P.A.

(57) ABSTRACT

Systems and methods for dynamically adjusting operation of a circuit within a semiconductor device are described herein. At least some illustrative embodiments include a system that includes a matching circuit including a first plurality of switching devices coupled to each other in parallel and not coupled in parallel to a resistive device, a driver circuit including a plurality of driver devices (the driver circuit adjusted based upon which of the switching devices are enabled), and processing logic that couples to the matching and driver circuits. The processing logic derives a binary value indicative of which of the switching devices are to be enabled, the binary value reflecting one or more process corners associated with the switching devices, and not reflecting one or more process corners associated with the resistive device. The processing logic further maps the binary value to a control value used to adjust the driver circuit.

25 Claims, 5 Drawing Sheets

US 7,573,288 B2

DYNAMICALLY ADJUSTING OPERATION OF A CIRCUIT WITHIN A SEMICONDUCTOR DEVICE

BACKGROUND

Digital processing and communication systems have continued to rapidly increase in speed. This increase in speed has brought with it increasingly tighter constraints that are imposed upon integrated circuits (ICs) used in such systems. Whether a given IC meets such constraints is controlled in significant part by how well the IC's processing parameters conform to target values. Threshold voltages, doping concentrations, and resistance values of the various layers that makeup a modem IC, just to name a few examples, can all affect whether an IC conforms to a given set of constraints. These parameters all affect the operational speed of individual devices within an IC.

One way that the speed or performance of the devices within an IC can be described is by way of what is known as "process corners." These corners describe the speed of a device or combination of devices measured at different operating condition extremes. Several operating parameters can be used to define a corner, such as, for example, temperature and voltage. Thus, for example, a resistive device and a capacitive device coupled in series can be used as a reference circuit within an IC, wherein the pre-charge and discharge rates of the circuit are measured under differing temperature and voltage conditions. The measured performance, when compared to the target or expected performance, provides a measure of how close one or more of the processing parameters of the IC are to their target values in the final operational IC.

In the case of complimentary metal-oxide semiconductor (CMOS) ICs, process corners are described in terms of the speed of metal-oxide semiconductor (MOS) devices with positively doped channels (PMOS devices), and MOS devices with negatively doped channels (NMOS devices), as well as in terms of the device structures used to measure the performance of a device. Thus, for example, two resistive devices and capacitive device pairs (the components of each pair coupled in series, one pair including PMOS devices and the other pair including NMOS devices) may be used to characterize a high temperature/low voltage process corner identified as an HL_RC corner. If the PMOS side is faster than the targeted or predicted speed at the given temperature and voltage, and the NMOS side is slower than targeted or predicted, the corner is referred to as an FS corner, meaning Fast/Slow or fast (relative to a target or "typical" speed) for the PMOS side, and slow (again relative to typical) for the NMOS side. The actual measured performance at a process corner can be used to determine if a device is within tolerance and will conform to a particular set of constraints.

As already noted, increases in the operational speed have continued to narrow constraints imposed upon ICs. But as the allowable deviations of the measured performance of devices at the various process corners decreases, the production yield of such ICs also tends to decrease, as it becomes increasingly difficult to control the process parameters to the resolution necessary to conform to target process corners. One solution that has been developed has been to design into ICs the ability to adjust the configuration of operational devices to compensate for variations in process corners that result from variations in processing parameters.

An example of a circuit that compensates for variations in process corners is the ZQ calibration circuit used within double data rate, version 3 (DDR3) synchronous dynamic random access memories (SDRAMs). Such a circuit adjusts the characteristic impedance of an output driver by compensating for changes in process corners associated with both active MOS devices as well as internal resistive devices. However, because resistive devices within both the calibration circuit and the compensated devices tend to be the dominant component, the resulting compensation reflects primarily the influence of process corners associated with the resistive devices. Thus, the resulting compensation may not reflect shifts in the process corners associated with the MOS devices, and in fact may compensate in a manner opposite that needed to compensate for shifts in the process corners associated with the MOS devices.

BRIEF DESCRIPTION OF THE DRAWINGS

For a detailed description of illustrative embodiments of the invention, reference will now be made to the accompanying drawings in which.

NOTATION AND NOMENCLATURE

Figure 1:
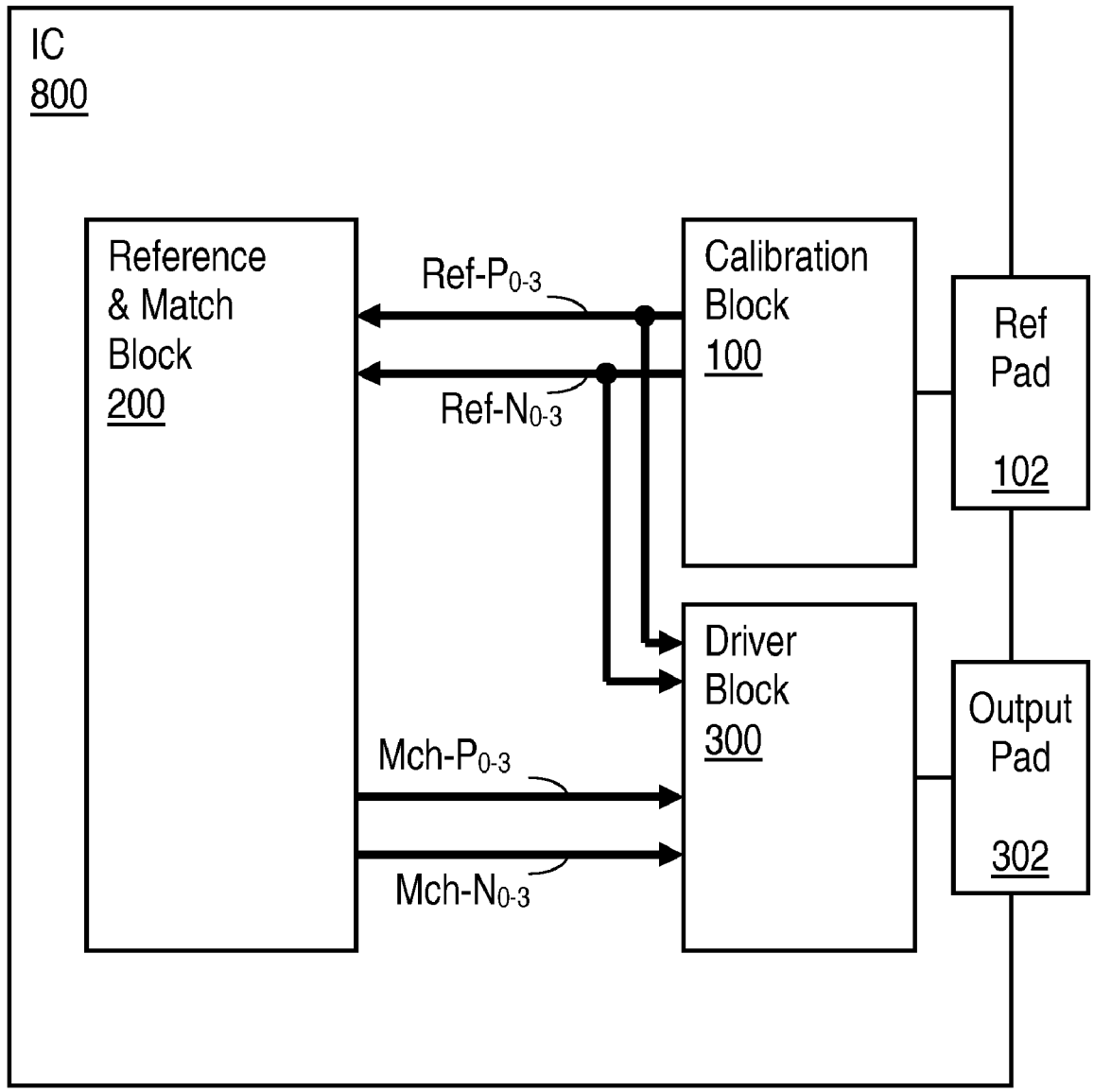
FIG. 1 shows an integrated circuit incorporating calibration, reference and match, and driver blocks, all constructed in accordance with at least some illustrative embodiments.

Certain terms are used throughout the following discussion and claims to refer to particular system components. This document does not intend to distinguish between components that differ in name but not function. In the following discussion and in the claims, the terms "including" and "comprising" are used in an open-ended fashion, and thus should be interpreted to mean "including but not limited to . . . ." Also, the term "couple" or "couples" is intended to mean either an indirect or direct electrical connection. Thus, if a first device couples to a second device, that connection may be through a direct electrical connection, or through an indirect electrical connection via other devices and connections. Additionally, the term "system" refers to a collection of two or more hardware and/or software components and may be used to refer to an electronic device, such as a memory device, a portion of a memory device, a combination of memory devices, etc. Further, the term "software" includes any executable code capable of running on a processor, regardless of the media used to store the software. Thus, code stored in non-volatile memory, and sometimes referred to as "embedded firmware," is included within the definition of software. Also, the term "driver" includes any circuit used to amplify a signal at any and all stages of processing of said signal, including, but not limited to, pre-drivers and output drivers, and further includes both inverting and non-inverting amplifying circuits.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims, unless otherwise specified. The discussion of any embodiment is meant only to be illustrative of that embodiment, and not intended to intimate that the scope of the disclosure, including the claims, is limited to that embodiment.

Because of the tight constraints of modern digital systems, it is no longer sufficient to simply design a device to operate as fast as possible. Instead, signals within a digital circuit must operate within specific tolerances, neither too fast nor too slow. These constraints not only affect output drivers within integrated circuits (ICs) that provide signals to the rest of a digital system, but also affect signals internal to an IC. Pre-driver circuits that provide signals to output drivers, for example, must conform to such constraints in order for the IC to interact with other system components properly. Examples of such constraints may include the target slew rate of a driver, the target gain of a driver, and the target maximum sourcing and sinking currents of a driver. However, it is not always possible to control the processing parameters associated with the production of an integrated circuit with the resolution or level of control necessary to consistently conform to today's tight constraints.

FIG. 1 shows an integrated circuit (IC) 800 that includes circuitry that identifies process corners associated with the processing parameters and operating characteristics of IC 800, that provides a series of reference impedances that are used to generate control values that are a function of the process corners, and that adjusts the operation of one or more driver stages so as to compensate for variations in the process corners associated with the devices being compensated. IC 800 includes a calibration block 100, a reference and match block 200, and a driver block 300, each coupled to the other. Calibration block 100 provides an initial reference impedance circuit that is calibrated to a precision external reference coupled to reference pad 102. The configuration of the calibrated reference impedance circuit is then duplicated by a similar circuit within reference and match block 200, and used as a basis for configuring a series of matching circuits to match the impedance of the duplicated reference impedance circuit. The matching circuit comprises devices of a particular type (e.g., N-Channel Metal-Oxide Semiconductor or NMOS devices), such that the configuration of the matching circuit that results in an impedance match is indicative of the process corners associated with that type of device. The configuration of the matching circuit of reference and match block 200 is used as a basis for configuring one or more driver stages of driver block 300 (which provides an output signal at output pad 302) so as to compensate for shifts in the process corners of IC 800 that might otherwise cause components within the IC to operate outside of the operating constraints of the system within which IC 800 operates.

Figure 2:
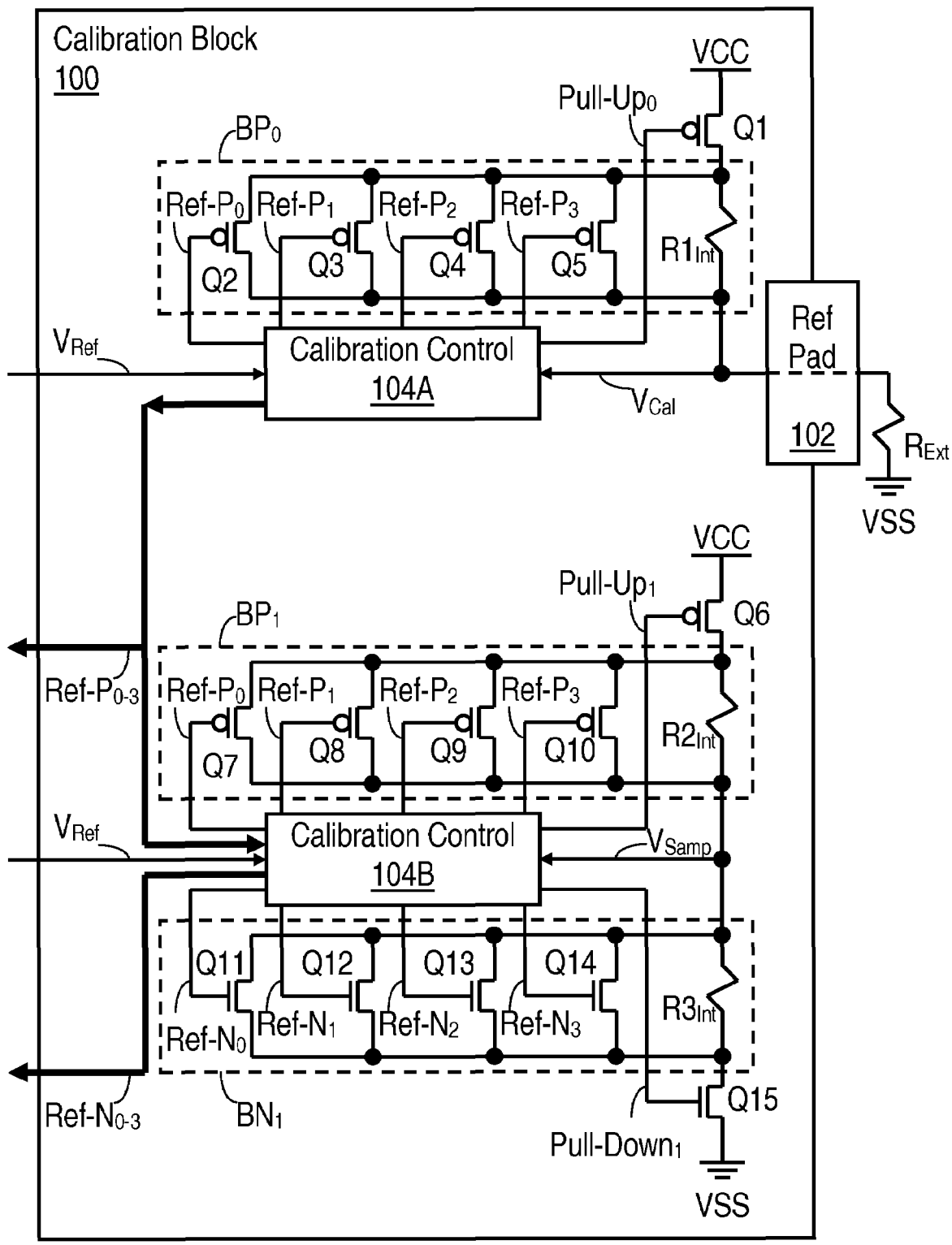
FIG. 2 shows a schematic diagram of the calibration block of FIG. 1, constructed in accordance with at least some illustrative embodiments.

FIG. 2 shows a calibration block 100, constructed in accordance with at least some illustrative embodiments, which couples to external resistor $R_{Ext}$ via Ref pad 102. $R_{Ext}$ is a precision resistor that is used as a reference against which the circuitry of calibration block 100 calibrates itself and the other output drivers of IC 800 of FIG. 1. The calibration circuitry includes PMOS devices Q1 through Q5, resistive device $R1_{Int}$, and calibration control 104A. PMOS devices Q2 through Q5 couple to each other and to resistive device $R1_{Int}$ in parallel, forming pull-up block $BP_0$. The pull-up block matches similar pull-up blocks used as PMOS pull-up drivers in each of the output buffers of IC 800. PMOS device Q1 couples between positive supply VCC and one side of the pull-up block, and external resistor $R_{Ext}$ couples between the other side of the pull-up block and supply return VSS.

When a calibration sequence is started, pull-up device Q1 is enabled via the Pull-Up$_0$ signal and devices Q2 through Q5 are disabled. Current flows through device Q1, resistive device $R1_{Int}$ and external resistor $R_{Ext}$. Calibration control 104A, which couples to and controls devices Q1 through Q5, monitors the voltage $V_{Cal}$ present at the node between the resistive device $R1_{Int}$ and resistor $R_{Ext}$, comparing $V_{Cal}$ against reference voltage $V_{Ref}$. Each of devices Q2 through Q5 are sequentially enabled and disabled through all sixteen possible combinations by calibration control logic 104A via pull-up control signals Ref-P$_0$ through Ref-P$_3$. As each device is enabled, the overall impedance is dropped as each enabled device adds a parallel path across resistive device $R1_{Int}$. The combination that results in a $V_{Cal}$ level that is closest to $V_{Ref}$ is the combination that most closely causes the impedance across Q1 and the pull-up block to match the impedance of reference resistor $R_{Ext}$. This is due to the fact that $V_{Ref}$ is configured to equal one half the difference between VCC and VSS. The resulting configuration is then used to calibrate the pull-up stages of the output drivers throughout IC 800 via pull-up control signals Ref-P$_0$ through Ref-P$_3$, which are routed to the output driver pull-up stages of driver block 300, as well as the pull-up reference circuit of reference and match block 200. Other configurations similar to that of FIG. 2 may be used that include additional pull-up blocks in both the calibration circuit and the pull-up stages of the output drivers to accommodate lower impedance values for $R_{Ext}$, and thus lower load impedances.

Once the pull-up stages are configured, a second calibration circuit is used to generate a similar configuration for the pull-down stages of the output drivers of IC 800. The second calibration circuit includes a second PMOS pull-up device Q6 and a second pull-up block $BP_1$, configured to match pull-up block $BP_0$, which includes PMOS devices Q7 through Q10 and internal resistive device $R2_{Int}$, each coupled in parallel to each other and coupled in series with pull-up device Q6, which also couples to VCC. The second calibration circuit includes a pull-down section, coupled to the pull-up section, which includes NMOS devices Q11 through Q14 and internal resistive device $R3_{Int}$, each coupled in parallel to each other and in series with pull-down device Q15, which also couples to VSS.

After the second pull-up block is configured, both pull-up device Q6 and pull-down device Q15 are enabled by calibration control block 104B, which couples to and controls devices Q6 through Q15. Devices Q11 through Q14 are then sequenced in the same manner as devices Q2 through Q5 were sequenced, in order to identify the configuration of enabled NMOS devices within pull-down block $BN_1$ that result in an overall combined impedance of the pull-down block and pull-down device Q15 that most closely matches the combined impedance of Q6 and pull-up block $BP_1$. The resulting configuration of the pull-down block is then used to calibrate the pull-down stages of the output drivers throughout IC 800 via pull-down control signals Ref-N$_0$ through Ref-N$_3$, which are routed to the output driver pull-down stages of driver block 300, as well as the pull-down reference circuit of reference and match block 200. Other configurations similar to that of FIG. 2 may be used that include additional pull-down blocks in both the calibration circuit and the pull-down stages of the output drivers to accommodate lower load impedances.

Figure 3:
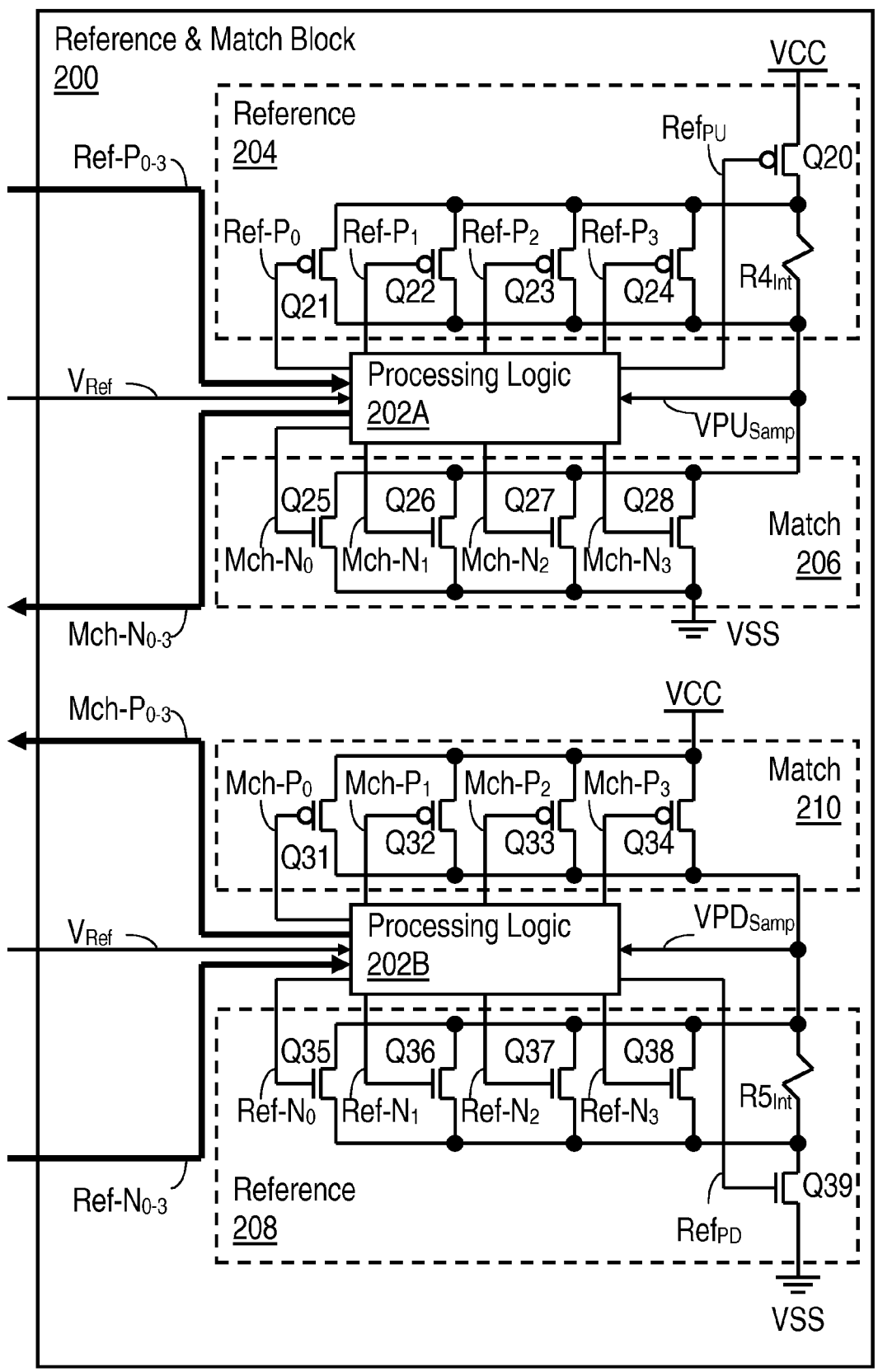
FIG. 3 shows a schematic diagram of the reference and match block of FIG. 1, constructed in accordance with at least some illustrative embodiments.

FIG. 3 shows reference and match block 200, constructed in accordance with at least some illustrative embodiments, which implements an impedance matching process to identify process corners, and to correlate an impedance matching configuration with the process corners associated with a particular type of semiconductor device. A pull-up reference circuit (Reference) 204 is configured to match the pull-up configuration of calibration block 100. Pull-up reference control signals Ref-P$_0$ through Ref-P$_3$ provide the information needed to configure pull-up reference circuit 204 as a "copy" of the pull-up configuration of calibration block 100. Pull-up reference circuit includes PMOS devices Q21 through Q24 and internal resistive device R4$_{Int}$, each coupled in parallel to each other, and PMOS pull-up device Q20, coupled to both VCC and the parallel combination of devices Q21 through Q24 and resistive device R4$_{Int}$. Processing logic 202A couples to and controls devices Q20 through Q24 of pull-up reference circuit 204. By matching the pull-up reference circuit, both in structure and configuration, to an existing reference circuit calibrated to an external precision reference, processing logic 202A configures pull-up reference circuit 204 so as to provide a known reference impedance.

Pull-up reference circuit 204 also couples to pull-down matching circuit 206, and pull-down matching circuit couples to VSS. In the illustrative embodiment of FIG. 3, pull-down matching circuit 206 includes NMOS devices Q25 through Q28, each coupled to and controlled by processing logic 202A, but does not include a resistive device. In at least some illustrative embodiments, processing logic 202A may be implemented in hardware, while in other illustrative embodiments processing logic 202A may be implemented in software (including embedded firmware and/or microcode), as well as combinations of hardware and software. Once pull-up reference circuit 204 is configured to provide a reference impedance, processing logic 202A enables pull-up device Q20 (via the Ref$_{PU}$ control signal), and selectively enables and disables each of devices Q25 through Q28 through all sixteen possible combinations. For each possible combination the difference between reference voltage V$_{Ref}$ (equal to one half the difference between VCC and VSS) and the pull-up sample voltage VPU$_{Samp}$ is monitored. The combination that results in the smallest voltage difference is the combination that results in an impedance of pull-down matching circuit 206 that most closely matches the impedance of pull-up reference circuit 204. The resulting combination is reflected in the binary value represented by pull-down match control signals Mch-N$_0$ through Mch-N$_3$. The pull-down match control signals are then provided to processing control logic 202C of FIG. 4, for use in configuring pre-driver 400 as is described further below.

Likewise, a similar operation is performed by pull-down reference circuit 208 and pull-up matching circuit 210, under the control of processing logic 202B. In the illustrative embodiment of FIG. 3, pull-down reference circuit 208 includes NMOS devices Q35 through Q38 and resistive device R5$_{Int}$, each coupled in parallel to each other. Pull down reference circuit 208 also includes NMOS pull-down device Q39, which couples to both VSS and the parallel combination of NMOS devices Q35 through Q38 and resistive device R5$_{Int}$. Processing logic 202B, which coupled to and controls each of devices Q31 through Q39, configures pull-down reference circuit 208 to match the pull-down configuration of calibration block 100. Pull-down reference control signals Ref-N$_0$ through Ref-N$_3$ provide the information needed to configure pull-down reference circuit 208 as a "copy" of the pull-down configuration of calibration block 100.

Pull-down reference circuit 208 couples to pull-up matching circuit 210, and pull-up matching circuit in turn couples to VCC. In the illustrative embodiment of FIG. 3, pull-up matching circuit 210 includes PMOS devices Q31 through Q34, each coupled to and controlled by processing logic 202B, but does not include a resistive device. In at least some illustrative embodiments, processing logic 202B, like processing logic 202A, may also be implemented in hardware, while in other illustrative embodiments processing logic 202B may be implemented in software (including embedded firmware and/or microcode), as well as combinations of hardware and software. Once pull-down reference circuit 208 is configured to provide a reference impedance, processing logic 202B enables pull-down device Q39 (via the Ref$_{PD}$ control signal) and selectively enables and disables each of devices Q31 through Q34 through all sixteen possible combinations. For each possible combination the difference between reference voltage VRef and the pull-down sample voltage VPD$_{Samp}$ is monitored. The combination that results in the smallest voltage difference is the combination that results in an impedance of pull-up matching circuit 210 that most closely matches the impedance of pull-down reference circuit 208. The resulting combination is reflected in the binary value represented by pull-up match control signals Mch-P$_0$ through Mch-P$_3$. The pull-down match control signals are then provided to processing control logic 202C of FIG. 4, for use in configuring pre-driver 400, as is also described below.

Figure 4:
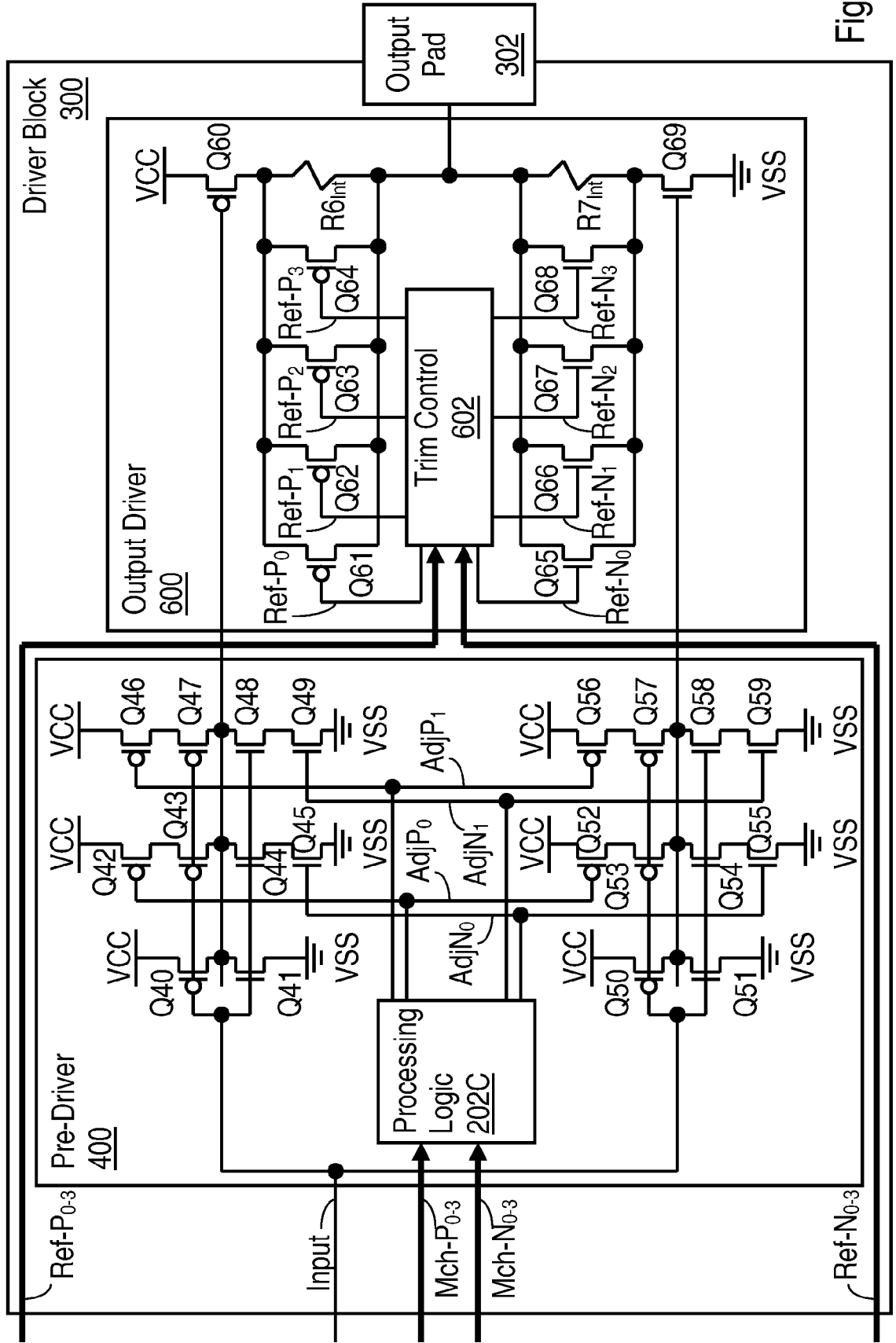
FIG. 4 shows a schematic diagram of the driver block of FIG. 1, constructed in accordance with at least some illustrative embodiments.

FIG. 4 shows driver block 300, constructed in accordance with at least some illustrative embodiments, which utilizes the correlated impedance matching information to compensate a pre-driver circuit based on the identified process corners. Match control signals Mch-P$_{0-3}$ and Mch-N$_{0-3}$ are provided to processing logic 202C of pre-driver 400. As with processing logic 202A and 202B, processing logic 202C may be implemented in hardware, software, or a combination of both hardware and software. Further, in some illustrative embodiments processing logic 202A, 202B and 202C may be separate, distinct hardware and/or software components, while in other illustrative embodiments some or all of processing logic 202A, 202B and 202C may be implemented in a single hardware and/or software component. Many different combinations of implementations for processing logic 202A, 202B and 202C will become apparent to those of ordinary skill in the art, and all such combinations are within the scope of the present disclosure.

In the illustrative embodiment of FIG. 4, pre-driver 400 includes processing logic 202C, which couples to and controls PMOS devices Q42, Q46, Q52 and Q56, as well as NMOS devices Q45, Q49, Q55 and Q59, each of which operate as auxiliary driver branch selection devices, as described below. Pre-driver 400 further includes PMOS primary driver device Q40, which couples to VCC and NMOS primary driver device Q41, which in turn further couples to VSS. The common pre-driver output node in between Q40 and Q41 couples to the gate of PMOS device Q60 of output driver 600. Primary driver devices Q50 and Q51 are similarly configured and couple to the gate of NMOS device Q69 of output driver 600. Output driver 600 includes PMOS devices Q60 through Q64 and resistive device R6$_{Int}$ on the pull-up side of the output driver, and NMOS devices Q65 through Q69 and resistive device R7$_{Int}$ on the pull-down side of the output driver, all coupled to and under the control of trim control 602. Each side of output driver 600 is structured in the same manner as the corresponding pull-up and pull-down blocks of calibration block 100. Each side of output driver 600 is further configured by trim control 602 to match the configuration of the corresponding pull-up and pull-down blocks of calibration block 100, based upon the configuration indicated by control signals Ref-$P_{0-31}$ and Ref-$N_{0-31}$ respectively. The final output signal of output driver 600 is made available on output pad 302.

In the illustrative embodiment of FIG. 4, the output node of each primary driver pair of pre-driver 400 couples to two auxiliary driver branches. Each auxiliary driver branch includes a PMOS auxiliary driver device (Q43, Q47, Q53 and Q57) and an NMOS auxiliary driver device (Q44, Q48, Q54 and Q58). Each auxiliary driver device couples to its corresponding pre-driver output node and to an auxiliary branch selection device corresponding to the branch and matching the device type of the auxiliary driver device (PMOS or NMOS). Each PMOS auxiliary branch selection device further couples to VCC, and each NMOS auxiliary branch selection device further couples to VSS. The gates of all of the primary and auxiliary driver devices are coupled together and all respond to a single input signal. While the primary driver devices of the illustrative embodiment of FIG. 4 always drive their respective pre-driver output nodes in response to the input signal, each of the auxiliary driver devices will only drive a corresponding pre-driver output node when the selection device associated with a given auxiliary driver devices has enabled that same side (pull-up or pull-down) of the corresponding branch. Thus, for example, Q43 will only drive the pre-driver output node coupled to Q60 when Q42 enables the pull-up side of the auxiliary branch that includes devices Q42 and Q43.

Each of the auxiliary branch selection devices is controlled by processing logic 202C via one of a plurality of adjustment control signals. These are $AdjP_{0-1}$, controlling the pull-up side of the auxiliary branches, and $AdjN_{0-1}$, controlling the pull-down side of the auxiliary branches. The adjustment control signals are configured in response to the binary values of match control signals Mch-$P_{0-3}$ and Mch-$N_{0-3}$, which in turn are responsive to the process corners associated with a particular class of device (e.g., PMOS or NMOS). The interpretation of the binary values of the match control signals depends upon the particular implementation of the matching circuits. In at least one illustrative embodiment, for example, each of the four PMOS devices of matching circuit 210 of FIG. 3 is sized such that the device controlled by Mch-P1 has half the impedance of Mch-P0, the device controlled by Mch-P2 has half the impedance of the device controlled by Mch-P1, and the device controlled by Mch-P3 has half the impedance of the device controlled by Mch-P2. Mch-P0 is the least significant bit and Mch-P3 is the most significant bit of the binary number represented by the control signals, and the resulting binary number thus represents the magnitude of the impedance adjustment made to the matching circuit to minimize the impedance difference between the matching circuit and the reference circuit, relative to other configurations of the matching circuit.

A large adjustment by the above-described matching circuit 210 is indicative of MOS devices with a higher impedance, which is indicative of a slow process corner. Similarly, a moderate value is indicative of a typical process corner, and a small value is indicative of a fast process corner. Each of the process corners identified correlates to processing parameter variations associated with the corresponding type of MOS device (PMOS or NMOS), due to the absence of a resistive device in the matching circuit. In at least some illustrative embodiments, ranges of values are assigned to each type of process corner. Thus, one example of such an assignment would be 0-5 as indicative of a fast process corner, 6-10 as indicative of a typical process corner, and 11-15 as indicative of a slow process corner. Each of these value ranges are mapped by processing logic 202C of FIG. 4 into values for each of the corresponding adjustment control signals, reflecting the process corner identified. Thus for example, if pull-down matching circuit 206 indicates a match value of 14 (slow) and pull-up matching circuit 210 indicates a match value of 7 (typical), processing logic 202C responds by asserting pull-down adjust signals AdjN0 and AdjN1 (enabling both auxiliary pull-down branches of the pre-driver), and by de-asserting adjust signal AdjP0 and asserting adjust signal AdjP1 (enabling only one auxiliary pull-up branch of the pre-driver). Many other configurations of the matching devices, matching signal binary values, and mappings of the matching signal binary values will become apparent to those skilled in the art, and all such configurations are within the scope of the present disclosure.

Figure 5:
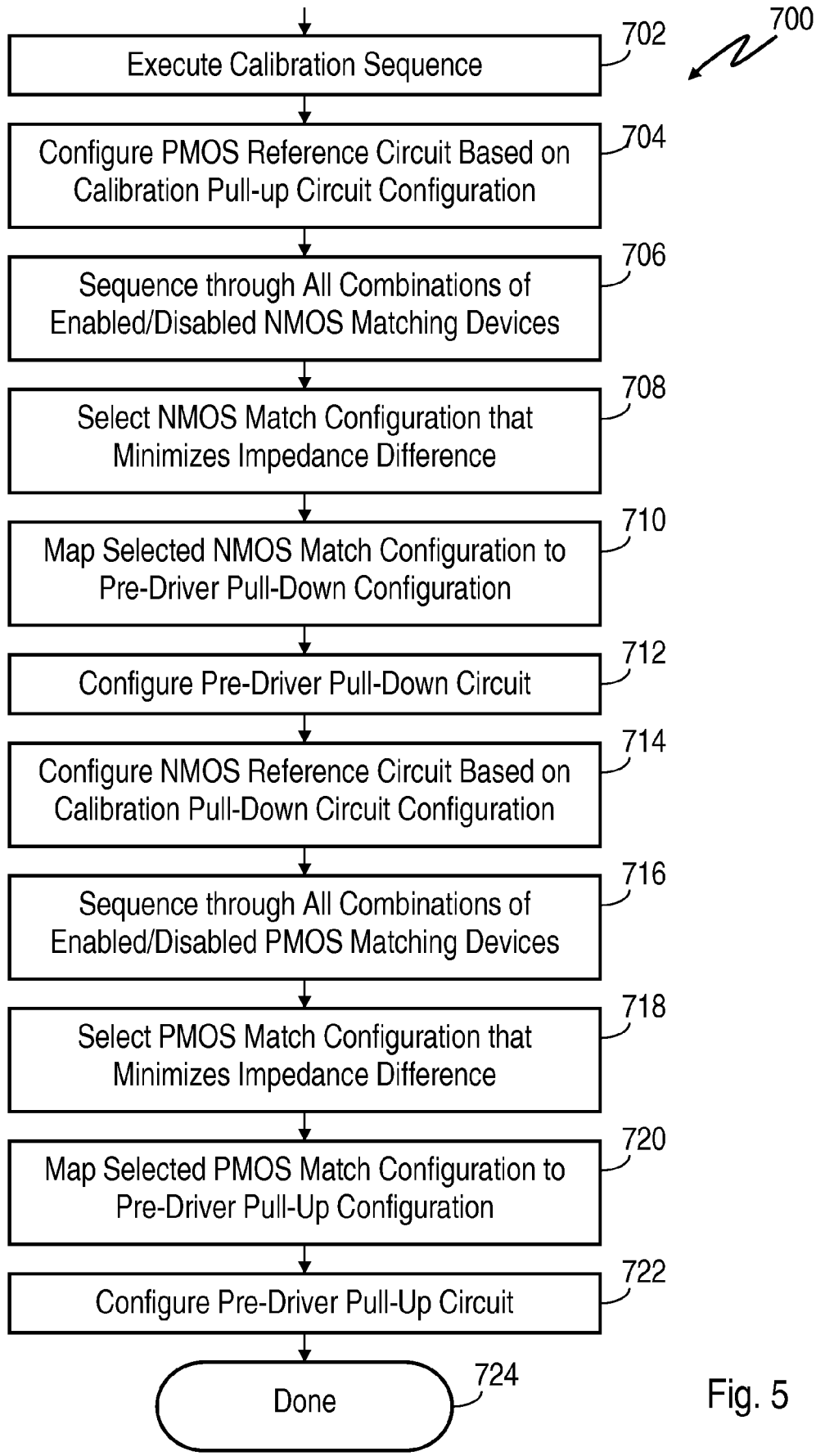
FIG. 5 shows a method for adjusting a driver circuit based upon identified semiconductor process corners, in accordance with at least some illustrative embodiments.

FIG. 5 shows a method 700 for identifying process corners and adjusting a driver circuit based on the identified corners, in accordance with at least some illustrative embodiments. After a calibration sequence has been performed (block 702), the configuration information for the calibration pull-up circuit is used to configure a PMOS reference circuit (block 704), thus providing a PMOS-based reference impedance. An NMOS matching circuit is sequenced through all combinations of enabled and disabled NMOS matching devices (block 706), and the configuration that minimizes the difference between the impedance of the PMOS reference circuit and the impedance of the NMOS matching circuit, relative to other configurations of the NMOS matching devices, is selected (block 708), thus identifying one or more process corners of the NMOS devices. The selected NMOS matching circuit configuration is mapped to a pre-driver pull-down configuration (block 710), based upon the identified process corners, and the pre-driver pull-down circuit is configured accordingly (block 712).

The configuration information for the calibration pull-down circuit is similarly used to configure an NMOS reference circuit (block 714), thus providing an NMOS-based reference impedance. A PMOS matching circuit is sequenced through all combinations of enabled and disabled NMOS matching devices (block 716), and the configuration that minimizes the difference between the impedance of the NMOS reference circuit and the impedance of the PMOS matching circuit, relative to other configurations of the PMOS matching devices, is selected (block 718), thus identifying one or more process corners of the PMOS devices. The selected PMOS matching circuit configuration is mapped to a pre-driver pull-up configuration (block 720), based upon the identified process corners, and the pre-driver pull-up circuit is configured accordingly (block 722), completing the method (block 724).

The systems and methods described herein may be used to determine process corners and adjust circuits, such as pre-driver circuit 400 of FIG. 4, at different times during the operation of a digital system. The detection of process corners and corresponding adjustment of one or more circuits may be performed when the system is initialized, after system initialization, periodically over time, or on demand through the execution of a command directed to the processing logic blocks previously described. In particular, by performing the detection and adjustment dynamically after initialization and during operation of the system, it is possible to re-compensate the adjusted circuit to account for shifts in the process corners that may occur over time (e.g., shifts due to increases in the operating temperature of the integrated circuit that includes the adjusted circuit).

The above disclosure is meant to be illustrative of the principles and various embodiments of the present invention. Numerous variations and modifications will become apparent to those skilled in the art once the above disclosure is fully appreciated. For example, although the pre-driver pull-up circuit is configured first in the illustrative embodiments described, the pre-driver pull-up and pull-down circuits may be configured in any order. Further, although a pre-driver circuit is described as the target circuit to be adjusted, those of ordinary skill in the art will recognize that a wide variety of circuits used within integrated circuits and other similar semiconductor devices may be adjusted using the systems and methods described herein, and all such circuits are within the scope of the present disclosure. Also, although the embodiments described are implemented using a complimentary metal-oxide semiconductor (CMOS) process, other MOS processes (e.g., NMOS only and PMOS only), as well as other non-MOS processes (e.g., bipolar) may be used to implement the system and methods described, as well as any combination of process. All such processes and combinations of processes are within the scope of the present disclosure. Additionally, although the present disclosure describes a calibration circuit similar to that used within a memory device, the present disclosure is not intended to be limited to memory devices, but also may include any other device that may be constructed using the semiconductor processes discussed herein. It is intended that the following claims be interpreted to embrace all such variations and modifications.

What is claimed is:

1. A system, comprising:
a matching circuit comprising a first plurality of switching devices coupled to each other in parallel and not coupled in parallel to a resistive device;
a driver circuit comprising a plurality of driver devices, the driver circuit adjusted based upon which of the first plurality of switching devices are enabled; and
processing logic that couples to the matching circuit and the driver circuit;
wherein the processing logic derives a binary value indicative of which of the first plurality of switching devices are to be enabled, the binary value reflecting one or more process corners associated with the first plurality of switching devices, and not reflecting one or more process corners associated with the resistive device; and
wherein the processing logic further maps the binary value to a control value used to adjust the driver circuit.

2. The system of claim 1, wherein the driver circuit is adjusted to conform to a target performance parameter range comprising a parameter range selected from a group consisting of a target slew rate range, a target gain range, a target maximum sourcing current range, and a target maximum sinking current range.

3. The system of claim 1, further comprising:
a reference circuit, coupled to the matching circuit and the processing logic;
wherein the processing logic determines a voltage difference between a reference voltage and a voltage at a node that couples the reference circuit to the matching circuit; and
wherein the processing logic derives the binary value by identifying the combination of enabled and disabled switching devices of the first plurality of switching devices that results in the smallest voltage difference relative to at least one other combination of enabled and disabled switching devices of the first plurality of switching devices.

4. The system of claim 1, further comprising:
a reference circuit, coupled to the matching circuit and the processing logic, comprising a second plurality of switching devices coupled to each other in parallel and further coupled in parallel to a first internal resistive device; and
a calibration circuit, coupled to the processing logic, comprising a third plurality of switching devices coupled to each other in parallel and further coupled in parallel to a second internal resistive device;
wherein the processing logic selectively enables and disables the third plurality of switching devices to cause the calibration circuit to have an impedance that more closely matches the impedance of an external reference resistor, relative to at least one other configuration of the third plurality of switching devices; and
wherein the processing logic selectively enables and disables the second plurality of switching devices to match the configuration of the third plurality of switching devices.

5. The system of claim 4,
wherein the first, second, and third pluralities of switching devices and the plurality of driver devices each comprises metal-oxide field effect transistors (MOSFETs), and
wherein a first doping polarity of the MOSFETs of both the second and third pluralities of switching devices is opposite a second doping polarity of the MOSFETs of both the first plurality of switching devices and the plurality of driver devices.

6. The system of claim 1, wherein the processing logic adjusts the driver circuit when the system is initialized.

7. The system of claim 1, wherein the processing logic adjusts the driver circuit after initialization of the system is complete.

8. The system of claim 1, wherein the processing logic periodically adjusts the driver circuit.

9. The system of claim 1, wherein the processing logic adjusts the driver circuit on demand.

10. The system of claim 1, wherein the driver circuit comprises a pre-driver circuit.

11. An apparatus, comprising:
a reference circuit;
a first plurality of switching devices coupled to each other in parallel and not coupled in parallel to a resistive device, the first plurality of switching devices coupled in series with the reference circuit; and
processing logic that couples to the first plurality of switching devices and selectively configures a combination of enabled and disabled switching devices of the first plurality of switching devices that results in an impedance of the enabled switching devices more closely matching an impedance of the reference circuit than at least one other combination of enabled and disable switching devices of the first plurality of switching devices;
wherein the processing logic identifies one or more process corners associated with the first plurality of switching devices based upon which of the first plurality of switching devices are enabled.

12. The apparatus of claim 11, wherein the reference circuit comprises a second plurality of switching devices, each coupled in parallel to each other, and further comprises a resistive device coupled in parallel to the second plurality of switching devices.

13. The apparatus of claim 12, wherein the first and second plurality of switching devices each comprises metal-oxide field effect transistors (MOSFETs), and wherein a first doping polarity of the MOSFETs of the first plurality of switching devices is opposite a second doping polarity of the MOSFETs of the second plurality of switching devices.

14. The apparatus of claim 11, wherein the combination of enabled and disabled switching devices of the first plurality of switching devices is represented by a binary number, and wherein each bit of the binary number controls at least one switching device of the plurality of switching devices.

15. The apparatus of claim 11,
wherein the processing logic determines a voltage difference between a reference voltage and a voltage at a node that couples the reference circuit to the first plurality of switching devices; and
wherein the processing logic more closely matches the impedance of the enabled switching devices to the impedance of the reference circuit by selecting the combination of enabled and disabled switching devices of the first plurality of switching devices that results in the smallest voltage difference relative to at least one other combination of enabled and disabled switching devices of the first plurality of switching devices.

16. The apparatus of claim 11, wherein the processing logic configures the reference circuit to match a calibration circuit.

17. An apparatus, comprising:
a driver circuit comprising:
a plurality of primary driver devices; and
a plurality of auxiliary driver branches coupled in parallel to the one or more primary driver devices and not coupled in parallel to a resistive device, each of the plurality of auxiliary driver branches comprising an auxiliary driver device that is responsive to a same input signal as the primary driver device; and
processing logic that couples to the plurality of auxiliary driver branches, selectively configures a combination of enabled and disabled auxiliary driver branches, and causes enabled auxiliary driver branches to drive a common output signal in parallel with the primary driver device;
wherein the processing logic configures the combination of enabled and disabled auxiliary driver branches based upon one or more identified process corners associated with at least the primary driver devices.

18. The apparatus of claim 17, wherein each of the plurality of auxiliary driver branches further comprises a selection device coupled in series with the auxiliary driver device, and wherein the processing logic enables an auxiliary driver branch by enabling the selection devices within said auxiliary driver branch.

19. The apparatus of claim 17, wherein the processing logic further configures the combination of enabled and disabled auxiliary driver branches so as to more closely conform to a target performance parameter of the driver relative to other combinations of enabled and disabled auxiliary driver branches.

20. The apparatus of claim 19, wherein the target performance parameter comprises a parameter selected from a group consisting of a target slew rate, a target gain, a target maximum sourcing current, and a target maximum sinking current.

21. The apparatus of claim 17, wherein the driver circuit comprises a pre-driver circuit.

22. A method, comprising:
configuring a reference circuit to match a configuration of a calibration circuit; and
configuring a matching circuit such that an impedance of the reference circuit more closely matches an impedance of the matching circuit relative to at least one other configuration of the matching circuit, the configuration of the matching circuit depending upon one or more process corners of a first plurality of switching devices, but not depending upon one or more process corners of a resistive device.

23. The method of claim 22, further comprising mapping the configuration of the matching circuit to a configuration of at least part of a driver circuit, the mapping being based upon the one or more process corners of the first plurality of switching devices.

24. The method of claim 23, wherein the mapping comprises selecting the configuration that causes the at least part of the driver circuit to most closely conform to a target parameter, relative to other configurations of the at least part of the driver circuit, the target performance parameter comprising a parameter selected from a group consisting of a target slew rate, a target gain, a target maximum sourcing current, and a target maximum sinking current.

25. A method, comprising:
mapping a configuration of a matching circuit to a configuration of at least part of a driver circuit, the configuration of the matching circuit indicative of one or more process corners of a switching device within the matching circuit, but not indicative of one or more process corners of a resistive device;
wherein the mapping comprises selecting the configuration that causes the at least part of the driver circuit to most closely conform to a target parameter, relative to other configurations of the at least part of the driver circuit; and
wherein the mapping is based upon the one or more process corners of the switching device.

* * * * *